United States Patent
Kim

(10) Patent No.: US 11,716,887 B2
(45) Date of Patent: Aug. 1, 2023

(54) LIGHT EMITTING DISPLAY DEVICE WITH A REDUCED COUPLING CAPACITANCE BETWEEN THE CONDUCTIVE WIRING LINES

(71) Applicant: Samsung Display Co., LTD., Yongin-si (KR)

(72) Inventor: Yeon Kyung Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/546,971

(22) Filed: Dec. 9, 2021

(65) Prior Publication Data

US 2022/0208935 A1    Jun. 30, 2022

(30) Foreign Application Priority Data

Dec. 28, 2020 (KR) .................. 10-2020-0185320

(51) Int. Cl.
*H10K 59/131* (2023.01)
*H10K 59/121* (2023.01)
*H01L 27/12* (2006.01)
*H10K 59/179* (2023.01)

(52) U.S. Cl.
CPC ......... *H10K 59/131* (2023.02); *H01L 27/124* (2013.01); *H10K 59/1213* (2023.02); *H10K 59/1216* (2023.02); *H10K 59/179* (2023.02)

(58) Field of Classification Search
CPC ............. H10K 59/131; H10K 59/1216; H10K 59/1213; H10K 59/179; H10K 59/121; H01L 27/124
See application file for complete search history.

(56) References Cited

U.S. PATENT DOCUMENTS

| | | | | |
|---|---|---|---|---|
| 2017/0125502 A1* | 5/2017 | Ota | .................. | G09G 3/3291 |
| 2019/0196638 A1* | 6/2019 | Tominaga | ............... | G06F 3/044 |
| 2021/0057610 A1* | 2/2021 | Yang | .................. | H01L 25/0753 |
| 2021/0111323 A1* | 4/2021 | Kim | .................. | G09G 3/325 |

FOREIGN PATENT DOCUMENTS

| KR | 10-2020-0097869 A | 8/2020 |
|---|---|---|
| KR | 10-2021-0107208 A | 9/2021 |

* cited by examiner

*Primary Examiner* — Marcos D. Pizarro
*Assistant Examiner* — Adin Hrnjic
(74) *Attorney, Agent, or Firm* — Lewis Roca Rothgerber Christie LLP

(57) ABSTRACT

A display device includes a substrate including a plurality of pixel areas including first, second, and third pixels, a first voltage line extending in a first direction on the substrate, a second voltage line extending in a second direction crossing the first direction on the first voltage line and connected to the first voltage line, a first electrode of each of the first, second, and third pixels being on the second voltage line to receive a driving current, a second electrode of each of the first, second, and third pixels and a third electrode of each of the first, second, and third pixels, the second and third electrodes being parallel to the first electrode and connected to the second voltage line, a first contact electrode of each of the first, second, and third pixels, the first contact electrode being on the first electrode and connected to the first electrode.

20 Claims, 11 Drawing Sheets

GL: VGL, HGL, BGL
VSL: VVSL, HVSL

LIGHT EMITTING DISPLAY DEVICE WITH A REDUCED COUPLING CAPACITANCE BETWEEN THE CONDUCTIVE WIRING LINES

CROSS-REFERENCE TO RELATED APPLICATION

This application claims priority to and the benefit of Korean Patent Application No. 10-2020-0185320 filed on Dec. 28, 2020, in the Korean Intellectual Property Office, the entire content of which is incorporated by reference herein.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and a light emitting display device. Among the flat panel display devices, in the light emitting display device, because each of pixels of a display panel includes a light emitting element capable of emitting light by itself, an image can be displayed without a backlight unit providing light to the display panel. The light emitting element may be an organic light emitting diode using an organic material as a fluorescent material or an inorganic light emitting diode using an inorganic material as a fluorescent material.

SUMMARY

Aspects of embodiments of the present disclosure provide a display device capable of eliminating a black blurring phenomenon or removing noise at black levels by reducing a coupling capacitance between a gate line of a gate layer and a contact electrode of an anode layer.

However, aspects of embodiments of the present disclosure are not limited to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a substrate including a plurality of pixel areas including first, second, and third pixels, a first voltage line extending in a first direction on the substrate, a second voltage line extending in a second direction crossing the first direction on the first voltage line and connected to the first voltage line, a first electrode of each of the first, second, and third pixels, the first electrode being on the second voltage line to receive a driving current, a second electrode of each of the first, second, and third pixels and a third electrode of each of the first, second, and third pixels, the second and third electrodes being parallel to the first electrode and connected to the second voltage line, a first contact electrode of each of the first, second, and third pixels, the first contact electrode being on the first electrode and connected to the first electrode, and a second contact electrode of each of the first, second, and third pixels, the second contact electrode being at a same layer as the first contact electrode and insulated from the first, second, and third electrodes.

The display device may further include an active layer on the first voltage line, and an auxiliary gate line in a layer between the active layer and the second voltage line and extending in the first direction.

The second electrode of the second pixel may receive a low potential voltage from the second voltage line to reduce a capacitance between the auxiliary gate line and the second contact electrode of the second pixel.

The display device may further include a first gate line at a same layer as the first voltage line, and a second gate line at a same layer as the second voltage line and connected between the first gate line and the auxiliary gate line.

The display device may further include a first auxiliary electrode at a same layer as the auxiliary gate line to overlap the first gate line.

The second electrode of the first pixel may receive a low potential voltage from the second voltage line to reduce a capacitance between the first auxiliary electrode and the second contact electrode of the first pixel.

The display device may further include a second auxiliary electrode at a same layer as the second gate line to overlap the first gate line.

The second electrode of the first pixel may receive a low potential voltage from the second voltage line to reduce a capacitance between the second auxiliary electrode and the second contact electrode of the first pixel.

In a plan view, the first electrode of each of the first, second, and third pixels may have one end adjacent to the second gate line and other end adjacent to the second voltage line, the one end and the other end of the first electrode being cut, and the second electrode of each of the first, second, and third pixels may have one end adjacent to the second gate line, the one end of the second electrode being cut.

The display device may further include a connector extending in the second direction to connect the second electrode of the first pixel to the third electrode of the second pixel.

The display device may further include a connector extending in the second direction to connect the second electrode of the second pixel to the third electrode of the third pixel.

The first electrode may extend in the first direction, the second electrode may be on one side of the first electrode, and the third electrode may be on other side of the first electrode.

The second contact electrode of each of the first, second, and third pixels may include a first portion extending in the first direction on the second electrode, a second portion bent from the first portion and extending in the second direction, and a third portion bent from the second portion and located on the first electrode.

Each of the first, second, and third pixels may include a first transistor between a driving voltage line and a plurality of light emitting elements to supply a driving current to the plurality of light emitting elements, a second transistor configured to connect a data line to a first node that is a gate electrode of the first transistor based on a gate signal, a third transistor configured to connect a sensing line to a second node that is a source electrode of the first transistor based on the gate signal, and a storage capacitor connected between the first node and the second node.

The display device may further include a plurality of first light emitting elements connected between the first contact electrode and the second contact electrode, and a plurality of second light emitting elements connected between the second contact electrode and the third electrode.

The second contact electrode may be a third node between the plurality of first light emitting elements and the plurality of second light emitting elements.

The plurality of first light emitting elements may be aligned between the first electrode and the second electrode, and the plurality of second light emitting elements may be aligned between the first electrode and the third electrode.

The display device may further include a first connection electrode at a same layer as the second voltage line and connected between the first electrode and the source electrode of the first transistor. The gate electrode of the first transistor may be a first capacitor electrode of the storage capacitor, and the first connection electrode may be a second capacitor electrode of the storage capacitor.

The display device may further include a second connection electrode bent from the second voltage line to overlap the first voltage line in a thickness direction of the display device, and directly connected to the first voltage line through a plurality of contact holes.

According to an embodiment of the present disclosure, a display device includes a substrate including a plurality of pixel areas including first, second, and third pixels, a first voltage line extending in a first direction on the substrate, an active layer on the first voltage line, an auxiliary gate line extending in the first direction on the active layer, a second voltage line extending in a second direction crossing the first direction on the auxiliary gate line and connected to the first voltage line, a first electrode on the second voltage line and connected to the active layer, a second electrode and a third electrode parallel to the first electrode and connected to the second voltage line, a first contact electrode on the first electrode and connected to the first electrode, and a second contact electrode on the first electrode and the second electrode and insulated from the first, second, and third electrodes.

In accordance with a display device according to embodiments, a plurality of light emitting elements may be aligned between a first electrode and a second electrode, the first electrode may receive a driving current from a transistor, the second electrode may receive a low potential voltage, and a contact electrode on the second electrode may be insulated from the first and second electrodes. The second electrode may shield the coupling capacitance between the gate line and the contact electrode. Accordingly, the second electrode may reduce the coupling capacitance the gate line and the contact electrode and the display device may eliminate the black blurring phenomenon or remove noise at black levels.

It should be noted that the effects of the present disclosure are not limited to those described above, and other effects of the present disclosure will be apparent from the following description.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
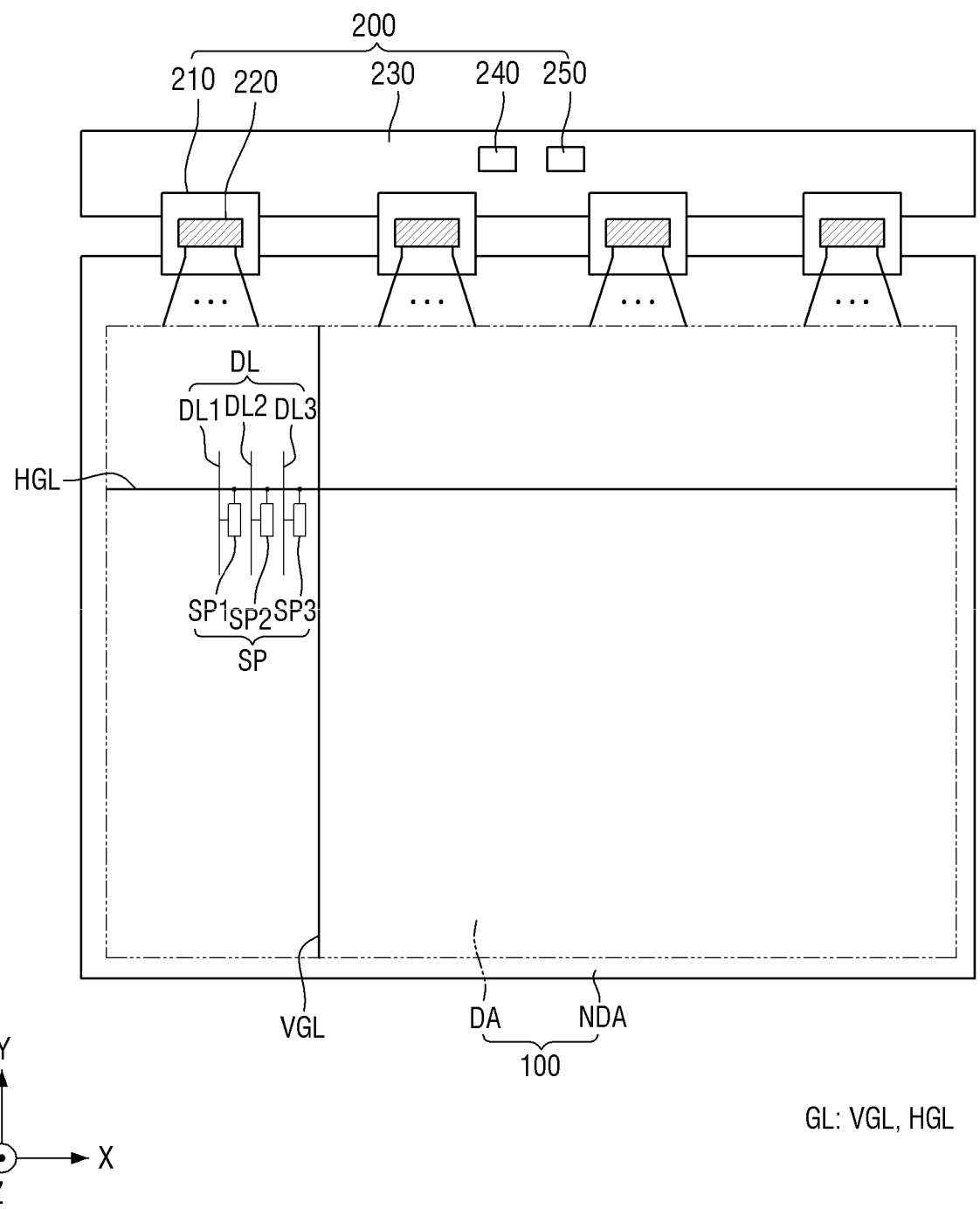
FIG. 1 is a plan view illustrating a display device according to one embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the present disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view illustrating a display device according to one embodiment.

The terms "above," "top" and "top surface" as used herein refer to an upward direction (i.e., a Z-axis direction) with respect to a display surface of the display device. The terms "below," "bottom" and "bottom surface" as used herein refer to a downward direction (i.e., a direction opposite to the Z-axis direction) with respect to a display surface of the display device. Further, the terms "left," "right," "upper," and "lower" respectively indicate corresponding directions on the display surface of the display device. For example, the term "left" indicates a direction opposite (or an opposite direction) to an X-axis direction, the term "right" indicates the X-axis direction, the term "upper" indicates a Y-axis direction, and the term "lower" indicates a direction opposite (or an opposite direction) to the Y-axis direction.

Referring to FIG. 1, a display device, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device may include a display panel 100 and a display driver 200.

The display panel 100 may have a rectangular shape in a plan view. For example, the display panel 100 may have a rectangular shape, in a plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a suitable curvature (e.g., a predetermined curvature). The planar shape of the display panel 100 is not limited to the rectangular shape, and may be formed in another polygonal shape, a circular shape or an elliptical shape. For example, the display panel 100 may be formed to be flat, but is not limited thereto. In another example, the display panel 100 may be bent with a suitable curvature (e.g., a predetermined curvature).

The display panel 100 may include a display area DA and a non-display area NDA around (e.g., surrounding) the display area DA along the edge or periphery of the display area DA.

The display area DA, which is an area for displaying an image, may be defined as the central area (e.g., the central region) of the display panel 100. The display area DA may include a plurality of pixels SP formed in pixel areas defined by a plurality of data lines DL and a plurality of gate lines GL crossing each other. The plurality of gate lines GL may include a plurality of vertical gate lines VGL (or first gate lines) and a plurality of horizontal gate lines HGL (or second gate lines). For example, the plurality of vertical gate lines VGL may be connected to a display driving circuit 220 to extend in the second direction (Y-axis direction) and the plurality of horizontal gate lines HGL may be connected to any one of the vertical gate lines VGL and extend in the first direction (X-axis direction). Each of the plurality of pixels SP may include first to third pixels SP1, SP2, and SP3. Each of the first to third pixels SP1, SP2, and SP3 may be connected to at least one horizontal gate line HGL and at least one data line DL. Each of the first to third pixels SP1, SP2, and SP3 may be defined as a minimum unit area that outputs light.

The plurality of data lines DL may extend in the second direction (Y-axis direction) and may be spaced from each other in the first direction (X-axis direction). The plurality of data lines DL may include first to third data lines DL1, DL2, and DL3. Each of the first to third data lines DL1, DL2, and DL3 may supply a data voltage to each of the first to third pixels SP1, SP2, and SP3.

The plurality of vertical gate lines VGL may extend in the second direction (Y-axis direction) and may be spaced from each other in the first direction (X-axis direction). The plurality of vertical gate lines VGL may be disposed in parallel with the plurality of data lines DL. The plurality of horizontal gate lines HGL may extend in the first direction (X-axis direction) and may be spaced from each other in the second direction (Y-axis direction). The plurality of horizontal gate lines HGL may cross the plurality of vertical gate lines VGL.

The connection relationship among the plurality of data lines DL, the plurality of vertical gate lines VGL, the plurality of horizontal gate lines HGL, and the plurality of pixels SP is not limited to that shown in FIG. 1. The connection relationship among the plurality of data lines DL, the plurality of vertical gate lines VGL, the plurality of horizontal gate lines HGL, and the plurality of pixels SP may be changed in design depending on the number and arrangement of the plurality of pixels SP.

The non-display area NDA may be defined as the remaining area of the display panel 100 except the display area DA. For example, the non-display area NDA may include fan-out lines connecting the data lines DL or the vertical gate lines VGL to the display driving circuit 220, and a pad portion connected to a flexible film 210.

The display driver 200 may be connected to the pad portion provided in the non-display area NDA of the display panel 100 to display an image on the plurality of pixels SP based on image data supplied from a display driving system. The display driver 200 may include the flexible film 210, the display driving 'circuit 220, a circuit board 230, a timing controller 240, and a power supply unit 250.

Input terminals provided on one side of the flexible film 210 may be attached to the circuit board 230 by a film attaching process, and output terminals provided at the other side of the flexible film 210 may be attached to the pad portion by the film attaching process. For example, the flexible film 210 may be a flexible film that can be bent, such as a tape carrier package or a chip on film. The flexible film 210 may be bent toward the lower portion of the display panel 100 to reduce the bezel area of the display device.

The display driving circuit 220 may be mounted on the flexible film 210. For example, the display driving circuit 220 may be implemented as an integrated circuit (IC). The display driving circuit 220 may receive digital video data and a data control signal from the timing controller 240, and according to the data control signal, convert the digital video data to an analog data voltage to supply it to the data lines DL through the fan-out lines. The display driving circuit 220 may generate a gate signal according to a gate control signal supplied from the timing controller 240, and sequentially supply the gate signal to the plurality of vertical gate lines VGL (e.g., sequentially supply the gate signal to the plurality of vertical gate lines VGL in a predetermined order).

The circuit board 230 may support the timing controller 240 and the power supply unit 250 and transmit signals and power between the components of the display driver 200. For example, the circuit board 230 may supply a signal supplied from the timing controller 240 and driving power supplied from the power supply unit 250 to the display driving circuit 220 to display an image on each pixel. To this end, a signal transmission line and a plurality of power lines may be provided on the circuit board 230.

The timing controller 240 may be mounted on the circuit board 230 and receive image data and a timing synchronization signal supplied from the display driving system through a user connector provided on the circuit board 230. The timing controller 240 may generate digital video data by arranging the image data to fit the pixel arrangement structure based on the timing synchronization signal, and may supply the generated digital video data to the display driving circuit 220. The timing controller 240 may generate the data control signal and the gate control signal based on the timing synchronization signal. The timing controller 240 may control the data voltage supply timing of the display driving circuit 220 based on the data control signal, and may control the gate signal supply timing of the display driving circuit 220 based on the gate control signal.

The power supply unit 250 may be disposed on the circuit board 230 to supply driving voltages to the display driving circuit 220 and the display panel 100. For example, the power supply unit 250 may generate a first driving voltage and supply it to a driving voltage line, and may generate a second driving voltage and supply it to a low potential voltage line. The first driving voltage may correspond to a high potential voltage for driving the plurality of pixels SP, and the second driving voltage may correspond to a low potential voltage commonly supplied to the plurality of pixels SP.

Figure 2:
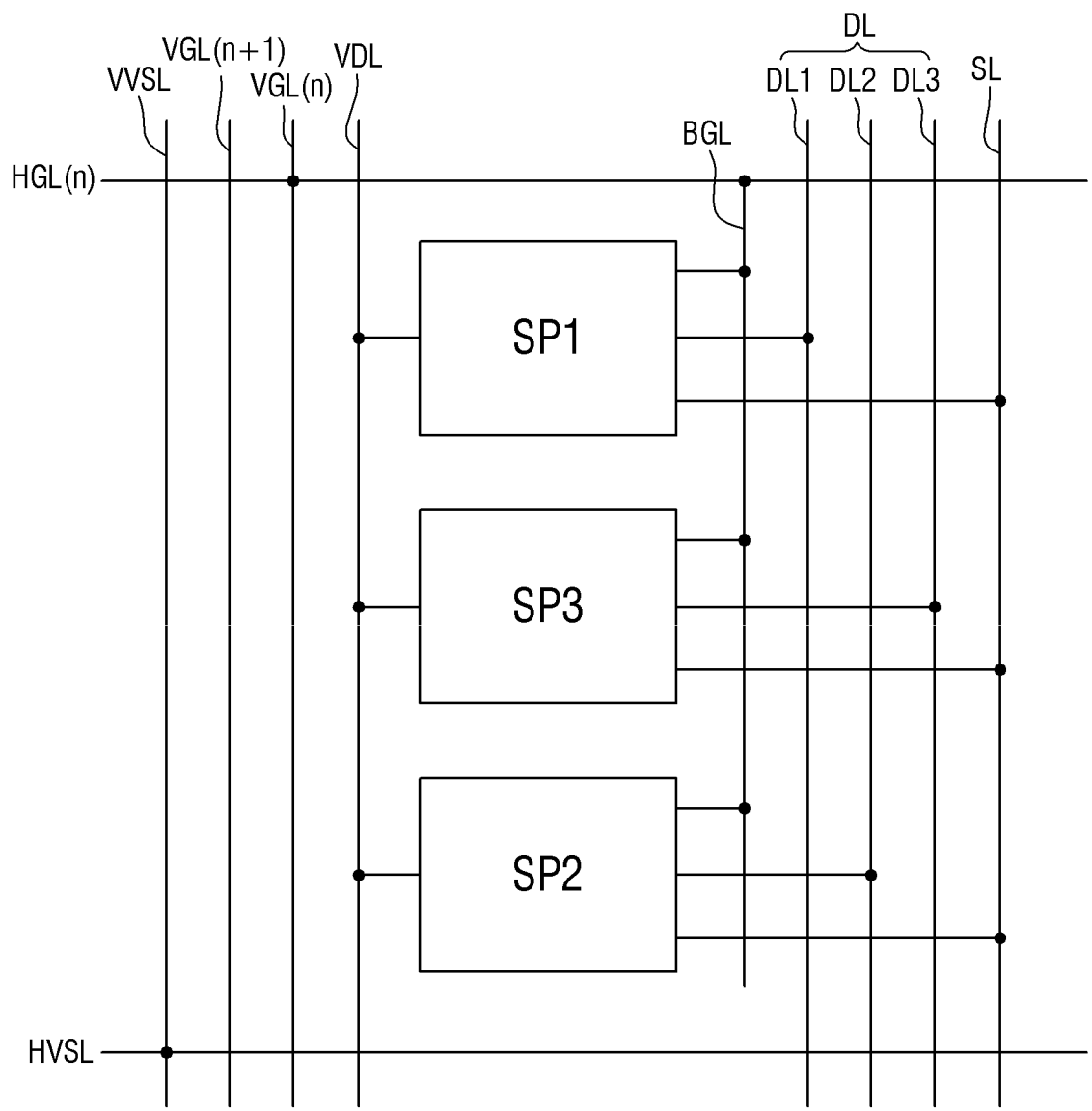
FIG. 2 is a diagram illustrating a plurality of pixels and lines in a pixel area in a display device according to one embodiment.

FIG. 2 is a diagram illustrating a plurality of pixels and lines in a pixel area in a display device according to one embodiment.

Referring to FIG. 2, the pixels SP may include first to third pixels SP1, SP2, and SP3. The pixel circuits of the first pixel SP1, the third pixel SP3 and the second pixel SP2 may be arranged along the opposite direction of the second direction (Y-axis direction), but the arrangement direction of the pixel circuits is not limited thereto. By way of example, it can be seen in FIG. 1 that the first to third pixels SP1, SP2, and SP3 are arranged along the first direction (X-axis direction).

A first voltage line VDL may extend in the second direction (Y-axis direction). The first voltage line VDL may be disposed on one side (e.g., the left side) of the pixel circuits of the first to third pixels SP1, SP2, and SP3. The first voltage line VDL may be a driving voltage line supplying a driving voltage or a high potential voltage to the plurality of pixels SP. The first voltage line VDL may supply a driving voltage to a transistor of each of the first to third pixels SP1, SP2, and SP3.

The gate line GL may include the vertical gate line VGL, the horizontal gate line HGL, and an auxiliary gate line BGL.

An $n^{th}$ vertical gate line VGL(n) (hereinafter, n is a positive integer) may extend in the second direction (Y-axis direction). The $n^{th}$ vertical gate line VGL(n) may be disposed on one side (e.g., the left side) of the first voltage line VDL. The $n^{th}$ vertical gate line VGL(n) may be connected between the display driving circuit 220 and an $n^{th}$ horizontal gate line HGL(n). The plurality of vertical gate lines VGL may cross the plurality of horizontal gate lines HGL. The $n^{th}$ vertical gate line VGL(n) may be insulated from the horizontal gate lines other than the $n^{th}$ horizontal gate line HGL(n). The $n^{th}$ vertical gate line VGL(n) may supply an $n^{th}$ gate signal received from the display driving circuit 220 to the $n^{th}$ horizontal gate line HGL(n).

The $n^{th}$ horizontal gate line HGL(n) may extend in the first direction (X-axis direction). The $n^{th}$ horizontal gate line HGL(n) may be disposed on the upper side of the pixel circuit of the first pixel SP1. The $n^{th}$ horizontal gate line HGL(n) may be connected between the $n^{th}$ vertical gate line VGL(n) and the auxiliary gate line BGL. The $n^{th}$ horizontal gate line HGL(n) may supply the $n^{th}$ gate signal received from the $n^{th}$ vertical gate line VGL(n) to the auxiliary gate line BGL.

An $(n+1)^{th}$ vertical gate line VGL(n+1) may extend in the second direction (Y-axis direction). The $(n+1)^{th}$ vertical gate line VGL(n+1) may be disposed on one side (e.g., the left side) of the $n^{th}$ vertical gate line VGL(n). The $(n+1)^{th}$ vertical gate line VGL(n+1) and the $n^{th}$ horizontal gate line HGL(n) may be insulated from each other. The $(n+1)^{th}$ vertical gate line VGL(n+1) may supply an $(n+1)^{th}$ gate signal to the plurality of pixels SP after (e.g., immediately after) when the $n^{th}$ vertical gate line VGL(n) supplies the $n^{th}$ gate signal.

A second voltage line VSL may include a second vertical voltage line VVSL (e.g., a second first voltage line) and a second horizontal voltage line HVSL (e.g., a second second voltage line). The second voltage line VSL may be a low potential voltage line supplying a low potential voltage to the plurality of pixels SP.

The second vertical voltage line VVSL may extend in the second direction (Y-axis direction). The second vertical voltage line VVSL may be disposed on one side (e.g., the left side) of the $(n+1)^{th}$ vertical gate line VGL(n+1). The second vertical voltage line VVSL may be connected between the power supply unit 250 and the second horizontal voltage line HVSL. The second vertical voltage line VVSL may supply the low potential voltage supplied from the power supply unit 250 to the second horizontal voltage line HVSL.

The second horizontal voltage line HVSL may extend in the first direction (X-axis direction). The second horizontal voltage line HVSL may be disposed on the lower side of the pixel circuit of the second pixel SP2. The second horizontal voltage line HVSL may supply the low potential voltage received from the second vertical voltage line VVSL to the first to third pixels SP1, SP2, and SP3.

The auxiliary gate line BGL may extend from the $n^{th}$ horizontal gate line HGL(n) in the opposite direction of the second direction (Y-axis direction). The auxiliary gate line BGL may be disposed on the other side (e.g., the right side) of the pixel circuits of the first to third pixels SP1, SP2, and SP3. The auxiliary gate line BGL may supply the $n^{th}$ gate signal received from the $n^{th}$ horizontal gate line HGL(n) to the pixel circuits of the first to third pixels SP1, SP2, and SP3.

A plurality of data lines DL may extend in the second direction (Y-axis direction). The plurality of data lines DL may supply the data voltage to the plurality of pixels SP. The plurality of data lines DL may include first to third data lines DL1, DL2, and DL3.

The first data line DL1 may extend in the second direction (Y-axis direction). The first data line DL1 may be disposed on the other side (e.g., the right side) of the auxiliary gate line BGL. The first data line DL1 may supply the data voltage received from the display driving circuit 220 to the pixel circuit of the first pixel SP1.

The second data line DL2 may extend in the second direction (Y-axis direction). The second data line DL2 may be disposed on the other side (e.g., the right side) of the first data line DL1. The second data line DL2 may supply the data voltage received from the display driving circuit 220 to the pixel circuit of the second pixel SP2.

The third data line DL3 may extend in the second direction (Y-axis direction). The third data line DL3 may be disposed on the other side (e.g., the right side) of the second data line DL2. The third data line DL3 may supply the data voltage received from the display driving circuit 220 to the pixel circuit of the third pixel SP3.

A sensing line SL may extend in the second direction (Y-axis direction). The sensing line SL may be disposed on the other side (e.g., the right side) of the third data line DL3. The sensing line SL may supply an initialization voltage received from the display driving circuit 220 to the pixel circuit of each of the first to third pixels SP1, SP2, and SP3. The sensing line SL may receive a sensing signal from the pixel circuit of each of the first to third pixels SP1, SP2, and SP3 to supply the sensing signal the display driving circuit 220.

Figure 3:
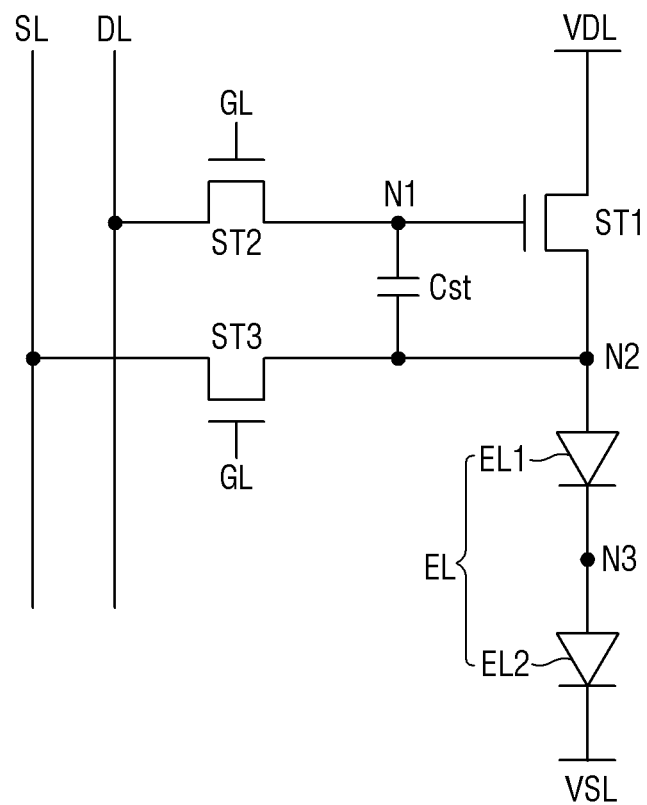
FIG. 3 is a circuit diagram illustrating a pixel of a display device according to one embodiment.

FIG. 3 is a circuit diagram illustrating a pixel of a display device according to one embodiment.

Referring to FIG. 3, each of the plurality of pixels SP may be connected to the gate line GL, the data line DL, the first voltage line VDL, the second voltage line VSL, and the sensing line SL.

Each of the plurality of pixels SP may include a plurality of switching elements, a storage capacitor Cst, and a plurality of light emitting elements EL. The switching elements may include first to third transistors ST1, ST2, and ST3.

The first transistor ST1 may include a gate electrode, a drain electrode, and a source electrode. The gate electrode of the first transistor ST1 may be connected to a first node N1, the drain electrode thereof may be connected to the first voltage line VDL and the source electrode thereof may be connected to a second node N2. The first transistor ST1 may control a source-drain current (or a driving current) according to the data voltage applied to the gate electrode.

The plurality of light emitting elements EL may include a first light emitting element EL1 and a second light emitting element EL2. The first and second light emitting elements EL1 and EL2 may be connected in series. The first and second light emitting elements EL1 and EL2 may receive a driving current to emit light. The light emission amount or luminance of the light emitting element EL may be proportional to the magnitude of the driving current. The light emitting element EL may be an inorganic light emitting element including a first electrode, a second electrode, and an inorganic semiconductor disposed between the first electrode and the second electrode.

The first electrode of the first light emitting element EL1 may be connected to the second node N2, and the second electrode of the first light emitting element EL1 may be connected to a third node N3. The first electrode of the first light emitting element EL1 may be connected to the source electrode of the first transistor ST1, the source electrode of the third transistor ST3 and a second capacitor electrode of the storage capacitor Cst through the second node N2. The second electrode of the first light emitting element EL1 may be connected to the first electrode of the second light emitting element EL2 through the third node N3.

The first electrode of the second light emitting element EL2 may be connected to the third node N3 and the second electrode of the second light emitting element EL2 may be connected to the second voltage line VSL. The first electrode of the second light emitting element EL2 may be connected to the second electrode of the first light emitting element EL1 through the third node N3.

The second transistor ST2 may be turned on by the gate signal of the gate line GL to connect the data line DL to the first node N1 which is the gate electrode of the first transistor ST1. The second transistor ST2 may be turned on according to the gate signal to supply the data voltage to the first node N1. The gate electrode of the second transistor ST2 may be connected to the gate line GL, the drain electrode thereof may be connected to the data line DL, and the source electrode thereof may be connected to the first node N1. The source electrode of the second transistor ST2 may be connected to the gate electrode of the first transistor ST1 and a first capacitor electrode of the storage capacitor Cst through the first node N1.

The third transistor ST3 may be turned on by the gate signal of the gate line GL to connect the sensing line SL to the second node N2 which is the source electrode of the first transistor ST1. The third transistor ST3 may be turned on according to the gate signal to supply the initialization voltage to the second node N2. The gate electrode of the third transistor ST3 may be connected to the gate line GL, the drain electrode thereof may be connected to the sensing line SL, and the source electrode thereof may be connected to the second node N2. The source electrode of the third transistor ST3 may be connected to the source electrode of the first transistor ST1, the second capacitor electrode of the storage capacitor Cst and the first electrode of the first light emitting element EL1 through the second node N2.

Figure 4:
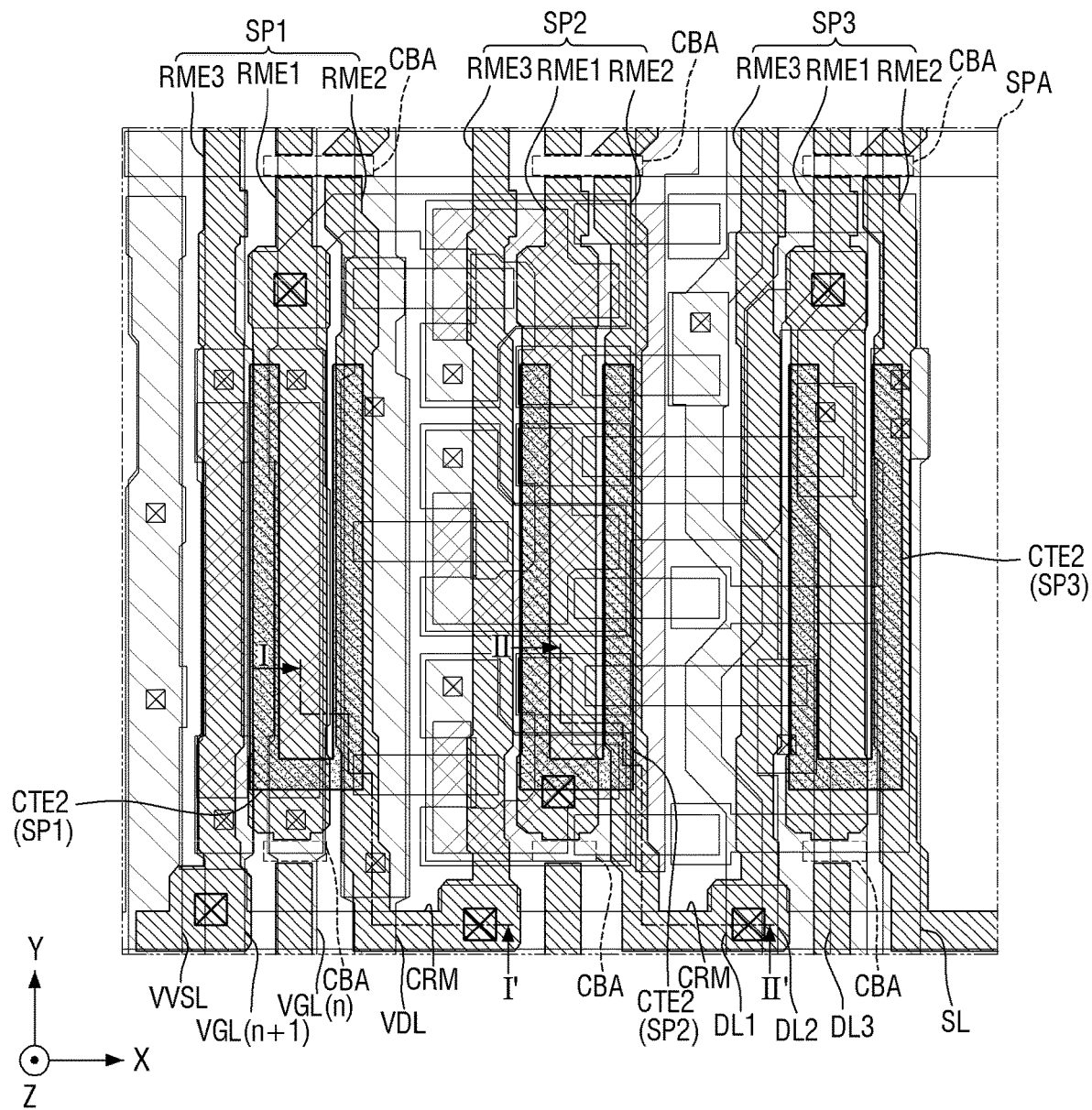
FIG. 4 is a plan view illustrating a pixel area in a display device according to one embodiment.
Figure 5:
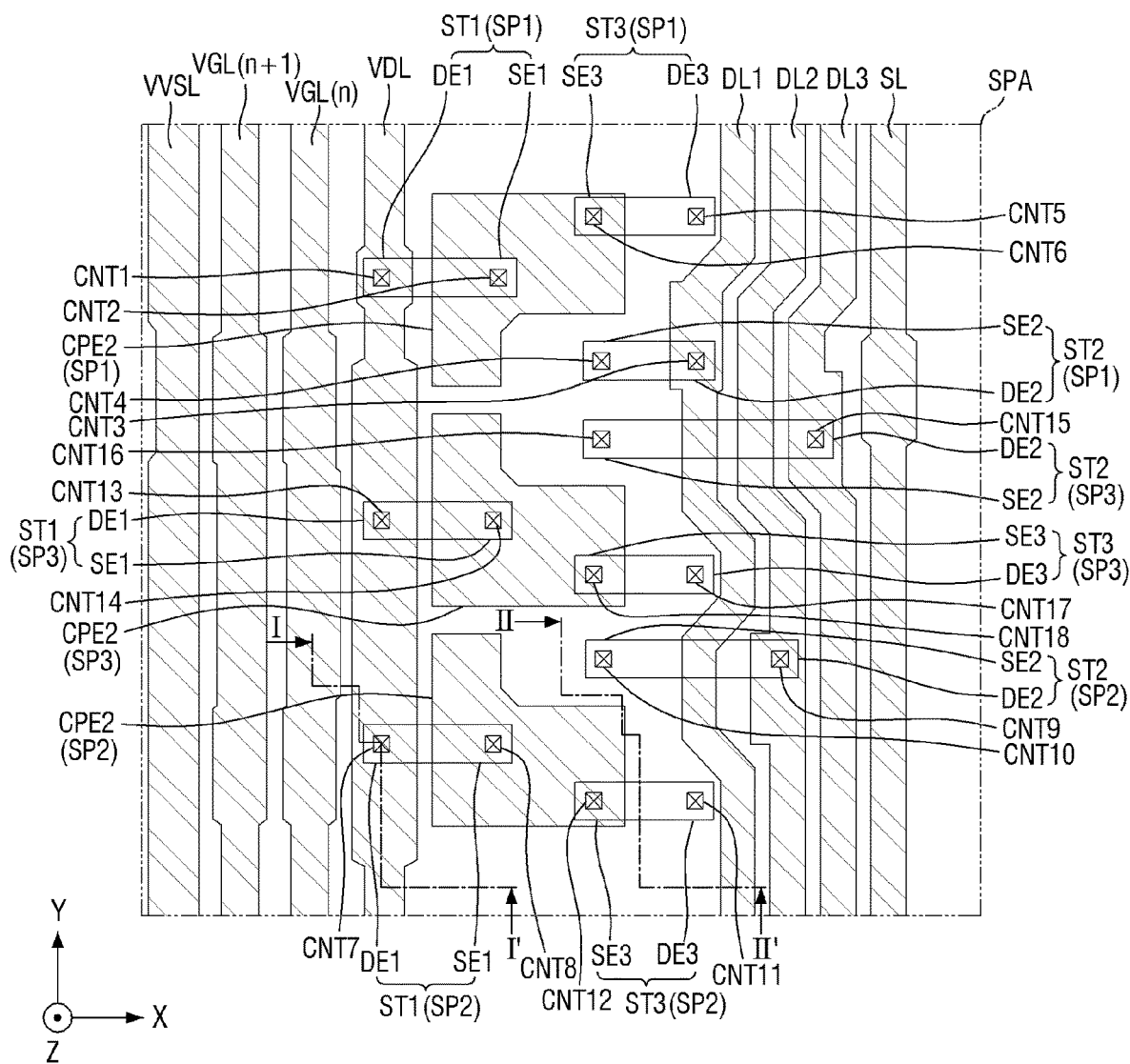
FIG. 5 is a plan view illustrating a metal layer and an active layer in the display device of FIG. 4.
Figure 6:
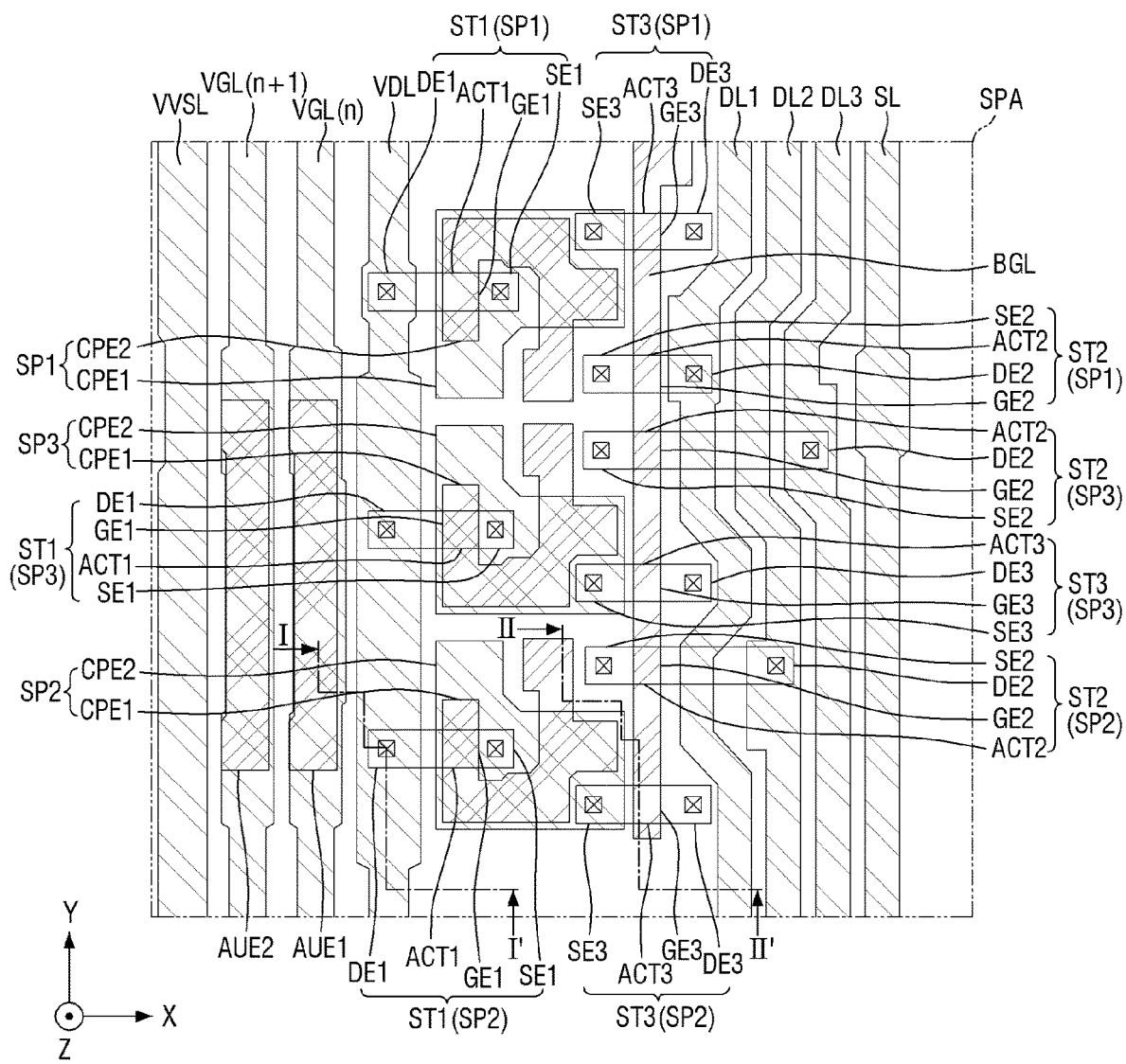
FIG. 6 is a plan view illustrating the metal layer, the active layer, and a gate layer in the display device of FIG. 4.
Figure 7:
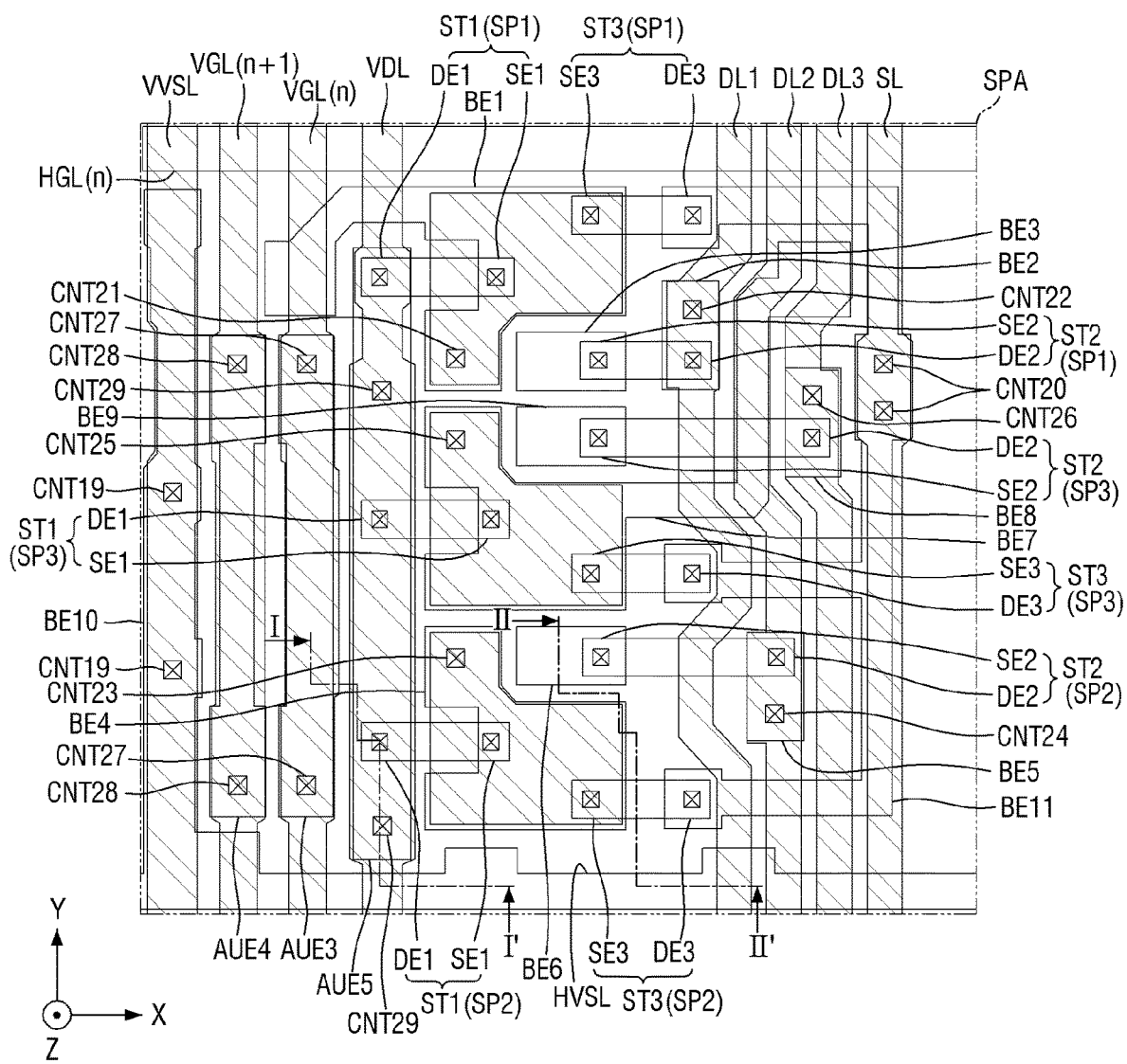
FIG. 7 is a plan view illustrating the metal layer, the active layer and a source-drain layer in the display device of FIG. 4.
Figure 8:
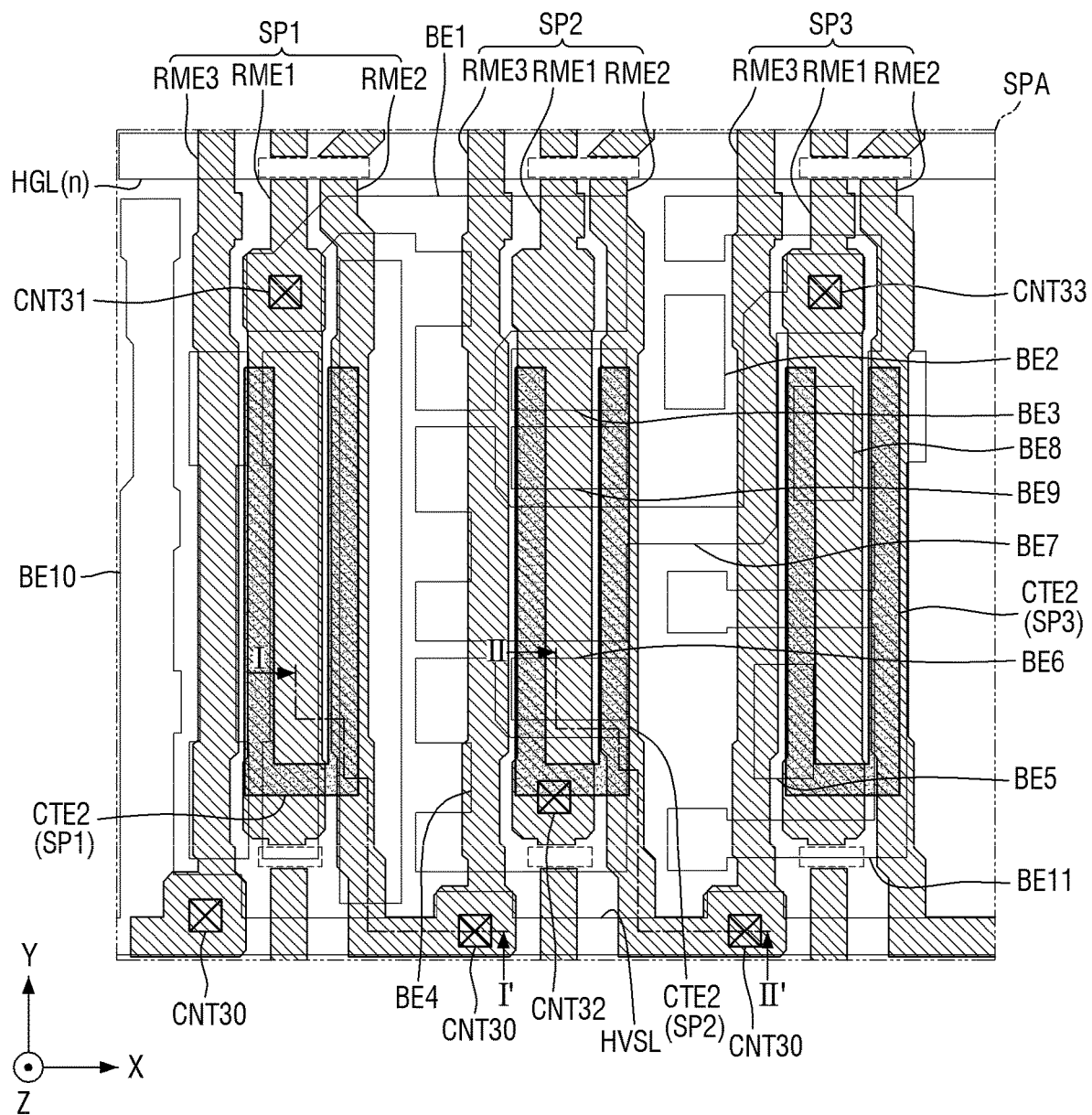
FIG. 8 is a plan view illustrating the source-drain layer, an electrode layer and the anode layer in the display device of FIG. 4.
Figure 9:
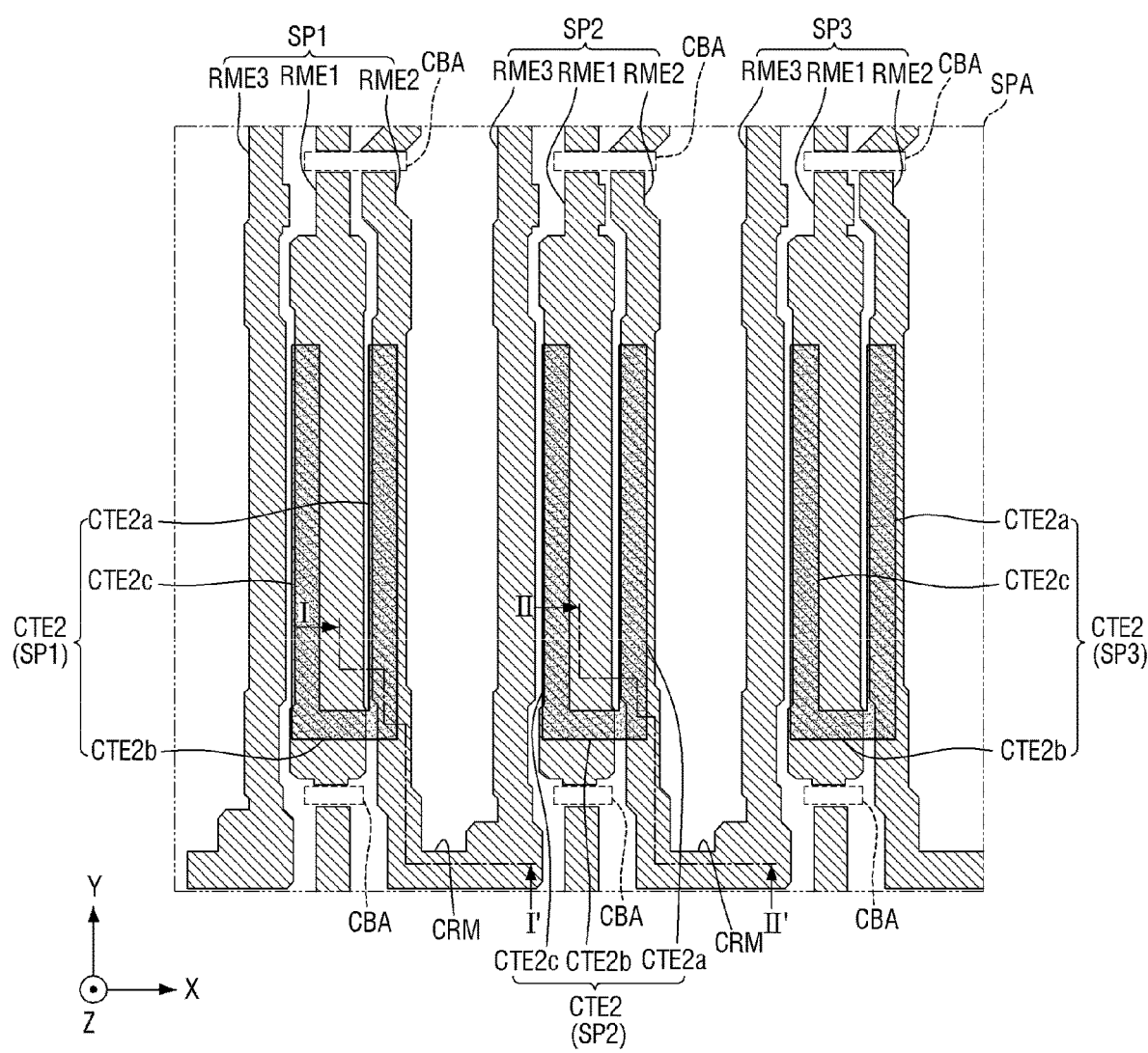
FIG. 9 is a plan view illustrating the electrode layer and the anode layer in the display device of FIG. 4.
Figure 10:
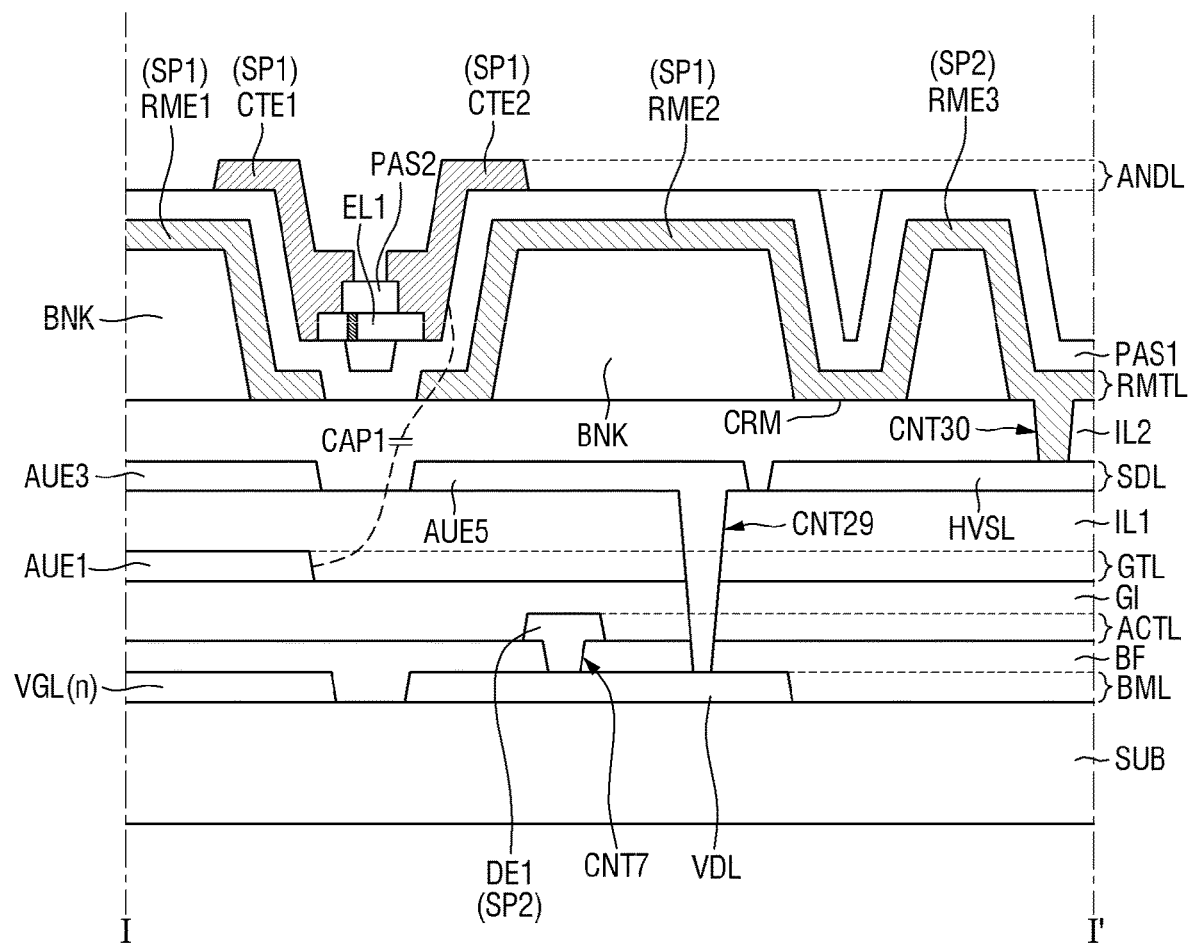
FIG. 10 is a cross-sectional view taken along the line I-I' of FIGS. 4-9.
Figure 11:
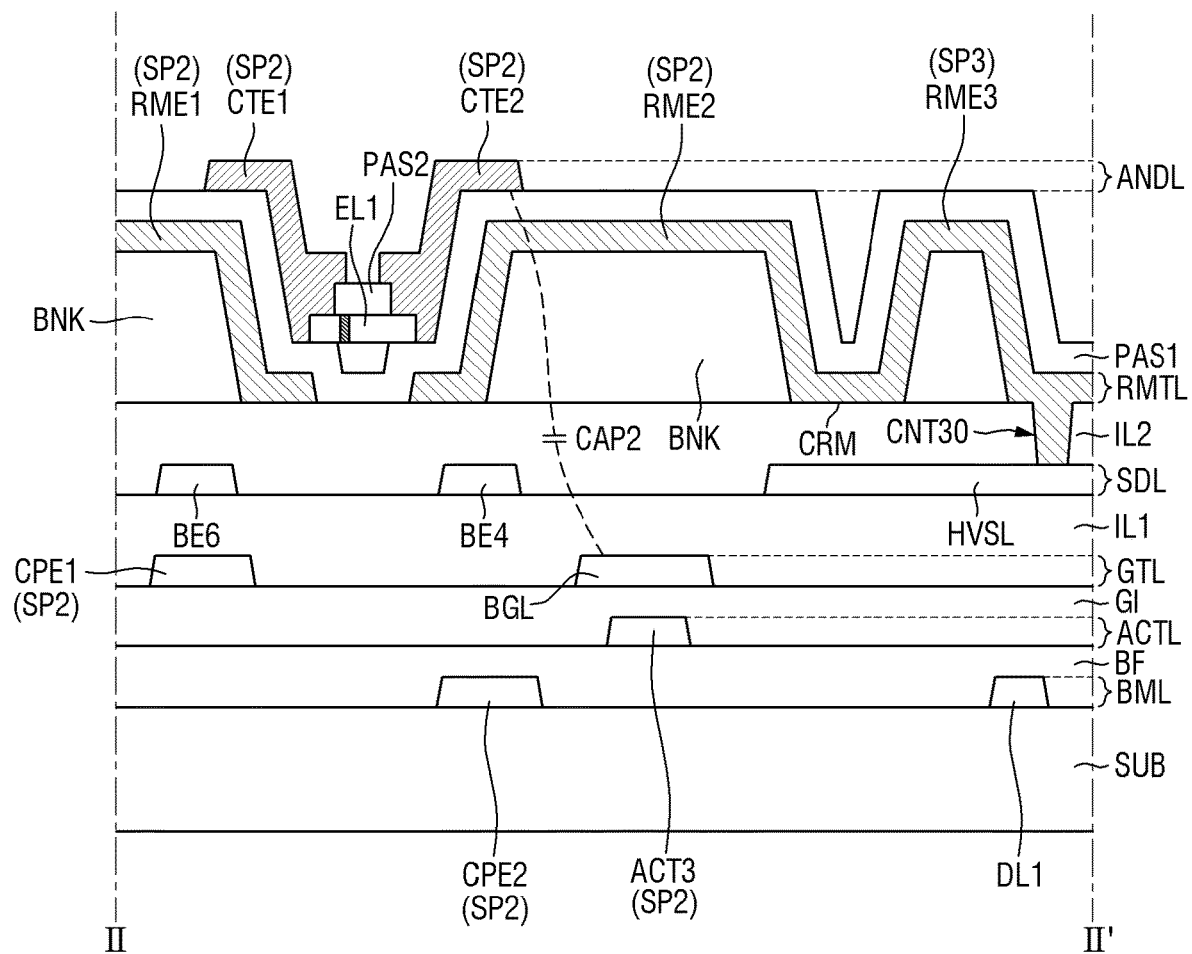
FIG. 11 is a cross-sectional view taken along the line II-II' of FIGS. 4-9.

FIG. 4 is a plan view illustrating a pixel area in a display device according to one embodiment. FIG. 5 is a plan view illustrating a metal layer and an active layer in the display device of FIG. 4. FIG. 6 is a plan view illustrating the metal layer, the active layer, and a gate layer in the display device of FIG. 4. FIG. 7 is a plan view illustrating the metal layer, the active layer, and a source-drain layer in the display device of FIG. 4. FIG. 8 is a plan view illustrating the source-drain layer, an electrode layer, and the anode layer in the display device of FIG. 4. FIG. 9 is a plan view illustrating the electrode layer and the anode layer in the display device of FIG. 4. FIG. 10 is a cross-sectional view taken along the line I-I' of FIGS. 4-9, and FIG. 11 is a cross-sectional view taken along the line II-II' of FIGS. 4-9. In FIGS. 10 and 11, a metal layer BML, a buffer layer BF, an active layer ACTL, a gate insulating layer GI, a gate layer GTL, a first insulating layer IL1, a source-drain layer SDL, a second insulating layer IL2, a bank BNK, an electrode layer RMTL, a first passivation layer PAS1, and an anode layer ANDL may be sequentially stacked on a substrate SUB.

Referring to FIGS. 4-11, the display panel 100 may include a plurality of pixel areas SPA. Each of the plurality of pixel areas SPA may include the first to third pixels SP1, SP2, and SP3. The pixel circuit of the first pixel SP1, the pixel circuit of the third pixel SP3, and the pixel circuit of the second pixel SP2 may be arranged along the opposite direction of the second direction (Y-axis direction). By way of example, it can be seen in FIG. 1 that the first to third pixels SP1, SP2, and SP3 are arranged along the first direction (X-axis direction).

The first voltage line VDL may be disposed on the metal layer BML. The first voltage line VDL may be disposed on one side (e.g., the left side) of the pixel circuits of the first to third pixels SP1, SP2 and SP3. The first voltage line VDL may overlap a fifth auxiliary electrode AUE5 of the source-drain layer SDL in the thickness direction (Z-axis direction), and may be connected to the fifth auxiliary electrode AUE5 through a plurality of twenty-ninth contact holes CNT29. Accordingly, the first voltage line VDL may be connected the fifth auxiliary electrode AUE5, thereby reducing line resistance.

The first voltage line VDL may be connected to a drain electrode DE1 of a first transistor ST1 of the first pixel SP1 through a first contact hole CNT1, connected to a drain electrode DE1 of a first transistor ST1 of the second pixel SP2 through a seventh contact hole CNT7, and connected to a drain electrode DE1 of a first transistor ST1 of the third pixel SP3 through a thirteenth contact hole CNT13. Accordingly, the first voltage line VDL may supply a driving voltage or a high potential voltage to the first to third pixels SP1, SP2, and SP3.

The $n^{th}$ vertical gate line VGL(n) may be disposed on the metal layer BML. The $n^{th}$ vertical gate line VGL(n) may be disposed on one side (e.g., the left side) of the first voltage line VDL. The $n^{th}$ vertical gate line VGL(n) may overlap a first auxiliary electrode AUE1 of the gate layer GTL in the thickness direction (Z-axis direction), and may be connected to the first auxiliary electrode AUE1. The $n^{th}$ vertical gate line VGL(n) may overlap a third auxiliary electrode AUE3 of the source-drain layer SDL in the thickness direction (Z-axis direction), and may be connected to the third auxiliary electrode AUE3 through a plurality of twenty-seventh contact holes CNT27. Accordingly, the $n^{th}$ vertical gate line VGL(n) may be connected to the first and third auxiliary electrodes AUE1 and AUE3, thereby reducing line resistance.

The $n^{th}$ horizontal gate line HGL(n) may be disposed on the source-drain layer SDL. The $n^{th}$ horizontal gate line HGL(n) may be disposed on the upper side of the pixel circuit of the first pixel SP1. The $n^{th}$ horizontal gate line HGL(n) may be connected between the $n^{th}$ vertical gate line VGL(n) and the auxiliary gate line BGL. The $n^{th}$ horizontal gate line HGL(n) may supply the $n^{th}$ gate signal received from the $n^{th}$ vertical gate line VGL(n) to the auxiliary gate line BGL.

The auxiliary gate line BGL may be disposed on the gate layer GTL. The auxiliary gate line BGL may be disposed on the other side (e.g., the right side) of the pixel circuits of the first to third pixels SP1, SP2, and SP3. The auxiliary gate line BGL may supply the $n^{th}$ gate signal received from the $n^{th}$ horizontal gate line HGL(n) to the pixel circuits of the first to third pixels SP1, SP2, and SP3.

The $(n+1)^{th}$-vertical gate line VGL(n+1) may be disposed on the metal layer BML The $(n+1)^{th}$-vertical gate line VGL(n+1) may be disposed on one side (e.g., the left side) of the $n^{th}$ vertical gate line VGL(n). The $(n+1)^{th}$-vertical gate line VGL(n+1) may overlap a second auxiliary electrode AUE2 of the gate layer GTL in the thickness direction (Z-axis direction), and may be connected to the second auxiliary electrode AUE2. The $(n+1)^{th}$-vertical gate line VGL(n+1) may overlap a fourth auxiliary electrode AUE4 of the source-drain layer SDL in the thickness direction (Z-axis direction), and may be connected to the fourth auxiliary electrode AUE4 through a plurality of twenty-eighth contact holes CNT28. Accordingly, the $(n+1)^{th}$, vertical gate line VGL(n+1) may be connected to the second and fourth auxiliary electrodes AUE2 and AUE4, thereby reducing line resistance.

The second voltage line VSL may include the second vertical voltage line VVSL and the second horizontal voltage line HVSL. The second voltage line VSL may be a low potential voltage line supplying a low potential voltage to the plurality of pixels SP.

The second vertical voltage line VVSL may be disposed on the metal layer BML. The second vertical voltage line VVSL may be disposed on one side (e.g., the left side) of the $(n+1)^{th}$-vertical gate line VGL(n+1). The second vertical voltage line VVSL may overlap a tenth connection electrode BE10 of the source-drain layer SDL in the thickness direction (Z-axis direction), and may be connected to the tenth connection electrode BE10 through a plurality of nineteenth contact holes CNT19. Accordingly, the second vertical voltage line VVSL may be connected to the tenth connection electrode BE10, thereby reducing line resistance.

The second horizontal voltage line HVSL may be disposed on the source-drain layer SDL. The second horizontal voltage line HVSL may extend from the lower side of the tenth connection electrode BE10 in the first direction (X-axis direction). The second horizontal voltage line HVSL and the tenth connection electrode BE10 may be integrally formed, but the present disclosure is not limited thereto. The second horizontal voltage line HVSL may supply the low potential voltage received from the second vertical voltage line VVSL to the first to third pixels SP1, SP2, and SP3.

The second horizontal voltage line HVSL may be connected to a third electrode RME3 of the first pixel SP1 disposed on the electrode layer RMTL through a thirtieth contact hole CNT30. Accordingly, the second horizontal voltage line HVSL may supply a low potential voltage to the third electrode RME3 of the first pixel SP1.

The second horizontal voltage line HVSL may be connected to the third electrode RME3 of the second pixel SP2 disposed on the electrode layer RMTL through the thirtieth contact hole CNT30. The third electrode RME3 of the second pixel SP2 may be connected to the second electrode RME2 of the first pixel SP1 through a connector CRM. The second electrode RME2 of the first pixel SP1, the connector CRM and the third electrode RME3 of the second pixel SP2 may be integrally formed, but the present disclosure is not limited thereto. Accordingly, the second horizontal voltage line HVSL may supply a low potential voltage to the second electrode RME2 of the first pixel SP1 and the third electrode RME3 of the second pixel SP2.

The second horizontal voltage line HVSL may be connected to the third electrode RME3 of the third pixel SP3 disposed on the electrode layer RMTL through the thirtieth contact hole CNT30. The third electrode RME3 of the third pixel SP3 may be connected to the second electrode RME2 of the second pixel SP2 through the connector CRM. The second electrode RME2 of the second pixel SP2, the connector CRM, and the third electrode RME3 of the third pixel SP3 may be integrally formed, but the present disclosure is not limited thereto. Accordingly, the second horizontal voltage line HVSL may supply a low potential voltage to the second electrode RME2 of the second pixel SP2 and the third electrode RME3 of the third pixel SP3.

The first data line DL1 may be disposed on the metal layer BML. The first data line DL1 may be disposed on the other side (e.g., the right side) of the auxiliary gate line BGL. The first data line DL1 may be connected to a second connection electrode BE2 of the source-drain layer SDL through a twenty-second contact hole CNT22, and the second connection electrode BE2 may be connected to the drain electrode DE2 of the second transistor ST2 of the first pixel SP1 through a third contact hole CNT3 (see, for example, FIG. 5). Accordingly, the first data line DL1 may supply the data voltage to the second transistor ST2 of the first pixel SP1.

The second data line DL2 may be disposed on the metal layer BML. The second data line DL2 may be disposed on the other side (e.g., the right side) of the first data line DL1. The second data line DL2 may be connected to a fifth connection electrode BE5 of the source-drain layer SDL through a twenty-fourth contact hole CNT24, and the fifth connection electrode BE5 may be connected to the drain electrode DE2 of the second transistor ST2 of the second pixel SP2 through a ninth contact hole CNT9 (see, for example, FIG. 5). Accordingly, the second data line DL2 may supply the data voltage to the second transistor ST2 of the second pixel SP2.

The third data line DL3 may be disposed on the metal layer BML. The third data line DL3 may be disposed on the other side (e.g., the right side) of the second data line DL2. The third data line DL3 may be connected to an eighth connection electrode BE8 of the source-drain layer SDL through a twenty-sixth contact hole CNT26, and the eighth connection electrode BE8 may be connected to the drain electrode DE2 of the second transistor ST2 of the third pixel SP3 through a fifteenth contact hole CNT15 (see, for example, FIG. 5). Accordingly, the third data line DL3 may supply the data voltage to the second transistor ST2 of the third pixel SP3.

The sensing line SL may be disposed on the metal layer BML. The sensing line SL may be disposed on the other side (e.g., the right side) of the third data line DL3. The sensing line SL may be connected to an eleventh connection electrode BE11 of the source-drain layer SDL through a plurality of twentieth contact holes CNT20. The eleventh connection electrode BE11 may be connected to the drain electrode DE3 of the third transistor ST3 of the first pixel SP1 through a fifth contact hole CNT5, connected to the drain electrode DE3 of the third transistor ST3 of the second pixel SP2 through an eleventh contact hole CNT11 (see, for example, FIG. 5), and connected to the drain electrode DE3 of the third transistor ST3 of the third pixel SP3 through a seventeenth contact hole CNT17 (see, for example, FIG. 5). Accordingly, the sensing line SL may supply the initialization voltage to the third transistor ST3 of each of the first to third pixels SP1, SP2, and SP3 and receive the sensing signal from the third transistor ST3.

The pixel circuit of the first pixel SP1 may include first to third transistors ST1, ST2 and ST3. The first transistor ST1 of the first pixel SP1 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed on the gate layer GTL. The gate electrode GE1 of the first transistor ST1 may be a part of a first capacitor electrode CPE1 of the storage capacitor Cst. The first capacitor electrode CPE1 may be connected to a third connection electrode BE3 of the source-drain layer SDL, and the third connection electrode BE3 may be connected to a source electrode SE2 of the second transistor ST2 through a fourth contact hole CNT4 (see, for example, FIG. 5).

The drain electrode DE1 and the source electrode SE1 of the first transistor ST1 may be made conductive by heat treatment of the active layer ACTL. The drain electrode DE1 of the first transistor ST1 may be connected to the first voltage line VDL of the metal layer BML through the first contact hole CNT1 (see, for example, FIG. 5). The drain electrode DE1 of the first transistor ST1 may receive the driving current from the first voltage line VDL.

The source electrode SE1 of the first transistor ST1 may be connected to a first connection electrode BE1 of the source-drain layer SDL through a second contact hole CNT2 (see, for example, FIG. 5). The first connection electrode BE1 may be connected to the second capacitor electrode CPE2 of the metal layer BML through a twenty-first contact hole CNT21. Accordingly, the storage capacitor Cst may be formed doubly between the first capacitor electrode CPE1 and the second capacitor electrode CPE2 and between the first capacitor electrode CPE1 and the first connection electrode BE1.

The first connection electrode BE1 may be connected to a source electrode SE3 of the third transistor ST3 through a sixth contact hole CNT6 (see, for example, FIG. 5). The first connection electrode BE1 may be connected to the first electrode RME1 of the electrode layer RMTL through a thirty-first contact hole CNT31.

The second transistor ST2 of the first pixel SP1 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the gate layer GTL. The gate electrode GE2 of the second transistor ST2 may be a part of the auxiliary gate line BGL.

The drain electrode DE2 of the second transistor ST2 may be connected to the first data line DL1 through the third contact hole CNT3 (see, for example, FIG. 5). The drain electrode DE2 of the second transistor ST2 may receive the data voltage of the first pixel SP1 from the first data line DL1.

The source electrode SE2 of the second transistor ST2 may be connected to the third connection electrode BE3 of the source-drain layer SDL through the fourth contact hole CNT4 (see, for example, FIG. 5). The third connection electrode BE3 may be connected to the first capacitor electrode CPE1 to be connected to the gate electrode GE1 of the first transistor ST1.

The third transistor ST3 of the first pixel SP1 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the gate layer GTL. The gate electrode GE3 of the third transistor ST3 may be a part of the auxiliary gate line BGL.

The drain electrode DE3 of the third transistor ST3 may be connected to the eleventh connection electrode BE11 of the source-drain layer SDL through the fifth contact hole CNT5 (see, for example, FIG. 5). The eleventh connection electrode BE11 may be connected to the sensing line SL of the metal layer BML through the plurality of twentieth contact holes CNT20. The drain electrode DE3 of the third transistor ST3 may receive the initialization voltage from the sensing line SL. The drain electrode DE3 of the third transistor ST3 may supply the sensing signal to the sensing line SL.

The source electrode SE3 of the third transistor ST3 may be connected to the first connection electrode BE1 of the source-drain layer SDL through the sixth contact hole CNT6 (see, for example, FIG. 5). The first connection electrode BE1 may be connected to the source electrode SE1 of the first transistor ST1 through the second contact hole CNT2 (see, for example, FIG. 5), connected to the second capacitor electrode CPE2 of the metal layer BML through the twenty-first contact hole CNT21, and connected to the first electrode RME1 of the electrode layer RMTL through the thirty-first contact hole CNT31.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed on the gate layer GTL. The gate electrode GE1 of the first transistor ST1 may be a part of the first capacitor electrode CPE1 of the storage capacitor Cst. The first capacitor electrode CPE1 may be connected to a sixth connection electrode BE6 of the source-drain layer SDL, and the sixth connection electrode BE6 may be connected to the source electrode SE2 of the second transistor ST2 through a tenth contact hole CNT10 (see, for example, FIG. 5).

The drain electrode DE1 and the source electrode SE1 of the first transistor ST1 may be made conductive by heat treatment of the active layer ACTL. The drain electrode DE1 of the first transistor ST1 may be connected to the first voltage line VDL of the metal layer BML through the seventh contact hole CNT7 (see, for example, FIG. 5). The drain electrode DE1 of the first transistor ST1 may receive the driving voltage from the first voltage line VDL.

The source electrode SE1 of the first transistor ST1 may be connected to a fourth connection electrode BE4 of the source-drain layer SDL through an eighth contact hole CNT8 (see, for example, FIG. 5). The fourth connection electrode BE4 may be connected to the second capacitor electrode CPE2 of the metal layer BML through a twenty-third contact hole CNT23. Accordingly, the storage capacitor Cst may be formed doubly between the first capacitor electrode CPE1 and the second capacitor electrode CPE2 and between the first capacitor electrode CPE1 and the fourth connection electrode BE4.

The fourth connection electrode BE4 may be connected to the source electrode SE3 of the third transistor ST3 through a twelfth contact hole CNT12 (see, for example, FIG. 5). The fourth connection electrode BE4 may be connected to the first electrode RME1 of the electrode layer RMTL through a thirty-second contact hole CNT32.

The second transistor ST2 of the second pixel SP2 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the gate layer GTL. The gate electrode GE2 of the second transistor ST2 may be a part of the auxiliary gate line BGL.

The drain electrode DE2 of the second transistor ST2 may be connected to the second data line DL2 through the ninth contact hole CNT9 (see, for example, FIG. 5). The drain electrode DE2 of the second transistor ST2 may receive the data voltage of the second pixel SP2 from the second data line DL2.

The source electrode SE2 of the second transistor ST2 may be connected to the sixth connection electrode BE6 of the source-drain layer SDL through the tenth contact hole CNT10 (see, for example, FIG. 5). The sixth connection electrode BE6 may be connected to the first capacitor electrode CPE1 to be connected to the gate electrode GE1 of the first transistor ST1.

The third transistor ST3 of the second pixel SP2 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the gate layer GTL. The gate electrode GE3 of the third transistor ST3 may be a part of the auxiliary gate line BGL.

The drain electrode DE3 of the third transistor ST3 may be connected to the eleventh connection electrode BE11 of the source-drain layer SDL through the eleventh contact hole CNT11 (see, for example, FIG. 5). The eleventh connection electrode BE11 may be connected to the sensing line SL of the metal layer BML through the plurality of twentieth contact holes CNT20. The drain electrode DE3 of the third transistor ST3 may receive the initialization voltage from the sensing line SL. The drain electrode DE3 of the third transistor ST3 may supply the sensing signal to the sensing line SL.

The source electrode SE3 of the third transistor ST3 may be connected to the fourth connection electrode BE4 of the source-drain layer SDL through the twelfth contact hole CNT12 (see, for example, FIG. 5). The fourth connection electrode BE4 may be connected to the source electrode SE1 of the first transistor ST1 through the eighth contact hole CNT8 (see, for example, FIG. 5), connected to the second capacitor electrode CPE2 of the metal layer BML through the twenty-third contact hole CNT23, and connected to the first electrode RME1 of the electrode layer RMTL through the thirty-second contact hole CNT32.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed on the gate layer GTL. The gate electrode GE1 of the first transistor ST1 may be a part of the first capacitor electrode CPE1 of the storage capacitor Cst. The first capacitor electrode CPE1 may be connected to a ninth connection electrode BE9 of the source-drain layer SDL, and the ninth connection electrode BE9 may be connected to the source electrode SE2 of the second transistor ST2 through a sixteenth contact hole CNT16 (see, for example, FIG. 5).

The drain electrode DE1 and the source electrode SE1 of the first transistor ST1 may be made conductive by heat treatment of the active layer ACTL. The drain electrode DE1 of the first transistor ST1 may be connected to the first voltage line VDL of the metal layer BML through the thirteenth contact hole CNT13 (see, for example, FIG. 5). The drain electrode DE1 of the first transistor ST1 may receive the driving voltage from the first voltage line VDL.

The source electrode SE1 of the first transistor ST1 may be connected to a seventh connection electrode BE7 of the source-drain layer SDL through a fourteenth contact hole CNT14 (see, for example, FIG. 5). The seventh connection electrode BE7 may be connected to the second capacitor electrode CPE2 of the metal layer BML through a twenty-fifth contact hole CNT25. Accordingly, the storage capacitor Cst may be formed doubly between the first capacitor electrode CPE1 and the second capacitor electrode CPE2 and between the first capacitor electrode CPE1 and the seventh connection electrode BE7.

The seventh connection electrode BE7 may be connected to the source electrode SE3 of the third transistor ST3 through an eighteenth contact hole CNT18 (see, for example, FIG. 5). The seventh connection electrode BE7 may be connected to the first electrode RME1 of the electrode layer RMTL through a thirty-third contact hole CNT33.

The second transistor ST2 of the third pixel SP3 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the gate layer GTL. The gate electrode GE2 of the second transistor ST2 may be a part of the auxiliary gate line BGL.

The drain electrode DE2 of the second transistor ST2 may be connected to the third data line DL3 through the fifteenth contact hole CNT15 (see, for example, FIG. 5). The drain electrode DE2 of the second transistor ST2 may receive the data voltage of the third pixel SP3 from the third data line DL3.

The source electrode SE2 of the second transistor ST2 may be connected to the ninth connection electrode BE9 of the source-drain layer SDL through the sixteenth contact hole CNT16 (see, for example, FIG. 5). The ninth connection electrode BE9 may be connected to the first capacitor electrode CPE1 to be connected to the gate electrode GE1 of the first transistor ST1.

The third transistor ST3 of the third pixel SP3 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the gate layer GTL. The gate electrode GE3 of the third transistor ST3 may be a part of the auxiliary gate line BGL.

The drain electrode DE3 of the third transistor ST3 may be connected to the eleventh connection electrode BE11 of the source-drain layer SDL through the seventeenth contact hole CNT17 (see, for example, FIG. 5). The eleventh connection electrode BE11 may be connected to the sensing line SL of the metal layer BML through the plurality of twentieth contact holes CNT20. The drain electrode DE3 of the third transistor ST3 may receive the initialization voltage from the sensing line SL. The drain electrode DE3 of the third transistor ST3 may supply the sensing signal to the sensing line SL.

The source electrode SE3 of the third transistor ST3 may be connected to the seventh connection electrode BE7 of the source-drain layer SDL through the eighteenth contact hole CNT18 (see, for example, FIG. 5). The seventh connection electrode BE7 may be connected to the source electrode SE1 of the first transistor ST1 through the fourteenth contact hole CNT14 (see, for example, FIG. 5), connected to the second capacitor electrode CPE2 of the metal layer BML through the twenty-fifth contact hole CNT25, and connected to the first electrode RME1 of the electrode layer RMTL through the thirty-third contact hole CNT33.

The first to third electrodes RME1, RME2, and RME3 of each of the first to third pixels SP1, SP2, and SP3 may be disposed on the electrode layer RMTL. The first to third electrodes RME1, RME2, and RME3 of the first pixel SP1 may be disposed on the left side of the pixel area SPA, the first to third electrodes RME1, RME2, and RME3 of the second pixel SP2 may be disposed on the center (or the central region) of the pixel area SPA, and the first to third electrodes RME1, RME2, and RME3 of the third pixel SP3 may be disposed on the right side of the pixel area SPA, but the present disclosure is not limited thereto. The first to third electrodes RME1, RME2, and RME3 of each of the first to third pixels SP1, SP2, and SP3 may extend in the second direction (Y-axis direction) and may be spaced from one another in the first direction (X-axis direction). The second electrode RME2 may be disposed on the right side of the first electrode RME1 and the third electrode RME3 may be disposed on the left side of the first electrode RME1, but the present disclosure is not limited thereto.

One end of the first electrode RME1 of each of the first to third pixels SP1, SP2, and SP3 may be adjacent to the nth horizontal gate line HGL(n) in a plan view and may be cut into a cutout portion CBA. The other end of the first electrode RME1 of each of the first to third pixels SP1, SP2 and SP3 may be adjacent to the second horizontal voltage line HVSL in a plan view and may be cut into the cutout portion CBA.

One end of the second electrode RME2 of each of the first to third pixels SP1, SP2, and SP3 may be adjacent to the nth horizontal gate line HGL(n) in a plan view and may be cut into the cutout portion CBA.

The plurality of first light emitting elements EL1 may be aligned between the first and second electrodes RME1 and RME2. Before the one end and the other end of the first electrode RME1 and the one end of the second electrode RME2 are cut into the cutout portions CBA, each of the first and second electrodes RME1 and RME2 may receive an alignment signal and an electric field may be formed between the first and second electrodes RME1 and RME2. For example, the plurality of first light emitting elements EL1 may be sprayed on the first and second electrodes RME1 and RME2 through an inkjet printing process, and the plurality of first light emitting elements EL1 dispersed in ink may be aligned by receiving a dielectrophoretic force by the electric field formed between the first and second electrodes RME1 and RME2.

The plurality of second light emitting elements EL2 may be aligned between the first and third electrodes RME1 and RME3. Before the one end and the other end of the first electrode RME1 are cut into the cutout portions CBA, each of the first and third electrodes RME1 and RME3 may receive an alignment signal and an electric field may be formed between the first and third electrodes RME1 and RME3. For example, the plurality of second light emitting elements EL2 may be sprayed on the first and third electrodes RME1 and RME3 through the inkjet printing process, and the plurality of second light emitting elements EL2 sprayed in ink may be aligned by receiving a dielectrophoretic force by the electric field formed between the first and third electrodes RME1 and RME3.

The first electrode RME1 of the first pixel SP1 may be connected to the first connection electrode BE1 of the source-drain layer SDL through the thirty-first contact hole CNT31. The first electrode RME1 may receive the driving current having passed through the first transistor ST1 from the first connection electrode BE1. The first electrode RME1 may supply the driving current to the plurality of first light emitting elements EL1 of the first pixel SP1.

The second electrode RME2 of the first pixel SP1 may be connected to the third electrode RME3 of the second pixel SP2 through the connector CRM. The second electrode RME2 of the first pixel SP1 may be connected to the second horizontal voltage line HVSL of the source-drain layer SDL through the thirtieth contact hole CNT30. Accordingly, the second electrode RME2 of the first pixel SP1 may receive a low potential voltage from the second horizontal voltage line HVSL.

The third electrode RME3 of the first pixel SP1 may be connected to the second horizontal voltage line HVSL of the source-drain layer SDL through the thirtieth contact hole CNT30. Accordingly, the third electrode RME3 of the first pixel SP1 may receive a low potential voltage from the second horizontal voltage line HVSL.

In FIG. 10, the second and third electrodes RME2 and RME3 of the first pixel SP1 may be connected to the second horizontal voltage line HVSL to receive a low potential voltage. The second contact electrode CTE2 of the first pixel SP1 may be insulated from the first to third electrodes RME1, RME2, and RME3, and the second and third electrodes RME2 and RME3 may shield the coupling capacitance between the gate layer GTL and the anode layer ANDL. Accordingly, the second and third electrodes RME2 and RME3 may reduce a first capacitance CAP1 between a second contact electrode CTE2 and the first and second auxiliary electrodes AUE1 and AUE2 of the gate layer GTL. In addition, the second and third electrodes RME2 and RME3 may reduce the capacitance between the second contact electrode CTE2 and the third and fourth auxiliary electrodes AUE3 and AUE4 of the source-drain layer SDL. Accordingly, the display device may reduce the coupling capacitance between the first auxiliary electrode AUE1 and the second contact electrode CTE2 connected to the $n^{th}$ vertical gate line VGL(n) to eliminate a black blurring phenomenon of the light emitting element EL or remove noise at black levels.

The first electrode RME1 of the second pixel SP2 may be connected to the fourth connection electrode BE4 of the source-drain layer SDL through the thirty-second contact hole CNT32. The first electrode RME1 may receive the driving current having passed through the first transistor ST1 from the fourth connection electrode BE4. The first electrode RME1 may supply the driving current to the plurality of first light emitting elements EL1 of the second pixel SP2.

The second electrode RME2 of the second pixel SP2 may be connected to the third electrode RME3 of the third pixel SP3 through the connector CRM. The second electrode RME2 of the second pixel SP2 may be connected to the second horizontal voltage line HVSL of the source-drain layer SDL through the thirtieth contact hole CNT30. Accordingly, the second electrode RME2 of the second pixel SP2 may receive a low potential voltage from the second horizontal voltage line HVSL.

The third electrode RME3 of the second pixel SP2 may be connected to the second horizontal voltage line HVSL of the source-drain layer SDL through the thirtieth contact hole CNT30. Accordingly, the third electrode RME3 of the second pixel SP2 may receive a low potential voltage from the second horizontal voltage line HVSL.

In FIG. 11, the second and third electrodes RME2 and RME3 of the second pixel SP2 may be connected to the second horizontal voltage line HVSL to receive a low potential voltage. The second contact electrode CTE2 of the second pixel SP2 may be insulated from the first to third electrodes RME1, RME2, and RME3, and the second and third electrodes RME2 and RME3 may shield the coupling capacitance between the gate layer GTL and the anode layer ANDL. Accordingly, the second and third electrodes RME2 and RME3 may reduce a second capacitance CAP2 between the second contact electrode CTE2 and the auxiliary gate line BGL of the gate layer GTL. Accordingly, the display device may reduce the coupling capacitance between the auxiliary gate line BGL supplying the $n^{th}$ gate signal and the second contact electrode CTE2 to eliminate the black blurring phenomenon of the light emitting element EL or remove noise at black levels.

The first electrode RME1 of the third pixel SP3 may be connected to the seventh connection electrode BE7 of the source-drain layer SDL through the thirty-third contact hole CNT33. The first electrode RME1 may receive the driving current having passed through the first transistor ST1 from the seventh connection electrode BE7. The first electrode RME1 may supply the driving current to the plurality of first light emitting elements EL1 of the third pixel SP3.

The second electrode RME2 of the third pixel SP3 may be connected to the second horizontal voltage line HVSL of the source-drain layer SDL. Accordingly, the second electrode RME2 of the third pixel SP3 may receive a low potential voltage from the second horizontal voltage line HVSL.

The third electrode RME3 of the third pixel SP3 may be connected to the second horizontal voltage line HVSL of the source-drain layer SDL through the thirtieth contact hole CNT30. Accordingly, the third electrode RME3 of the third pixel SP3 may receive a low potential voltage from the second horizontal voltage line HVSL.

The first contact electrode CTE1 and the second contact electrode CTE2 of each of the first to third pixels SP1, SP2 and SP3 may be disposed on the anode layer ANDL. The first contact electrode CTE1 may be disposed on the first electrode RME1 and may be connected to the first electrode RME1. The first contact electrode CTE1 may be connected between the first electrode RME1 and the plurality of first light emitting elements EL1. The first contact electrode CTE1 may correspond to an anode electrode of the plurality of first light emitting elements EL1, but the present disclosure is not limited thereto.

The second contact electrode CTE2 may be disposed on the first and second electrodes RME1 and RME2 and may be insulated from the first to third electrodes RME1, RME2, and RME3. The second contact electrode CTE2 may include first to third portions CTE2a, CTE2b and CTE2c. The first portion CTE2a of the second contact electrode CTE2 may be disposed on the second electrode RME2 and extend in the second direction (Y-axis direction). The second portion CTE2b of the second contact electrode CTE2 may be bent from the lower side of the first portion CTE2a thereof to extend in the opposite direction of the first direction (X-axis direction). The third portion CTE2c of the second contact electrode CTE2 may be bent from the left side of the second portion CTE2b thereof to extend in the second direction (Y-axis direction) and may be disposed on the first electrode RME1.

The second contact electrode CTE2 may be connected between the plurality of first light emitting elements EL1 and the plurality of second light emitting elements EL2. The second contact electrode CTE2 may correspond to the third node N3 of FIG. 3. The second contact electrode CTE2 may correspond to a cathode electrode of the plurality of first light emitting elements EL1, but is not limited thereto. The second contact electrode CTE2 may correspond to an anode electrode of the plurality of second light emitting elements EL2, and the third electrode RME3 may correspond to a cathode electrode of the plurality of second light emitting elements EL2, but the present disclosure is not limited thereto.

Although embodiments of the present disclosure have been described and illustrated herein, many modifications and variations will be apparent to those skilled in the art. Embodiments of the present disclosure are also defined in the following claims, and equivalents thereof.

What is claimed is:

1. A display device comprising:
    a substrate including a plurality of pixel areas comprising first, second, and third pixels;
    a first voltage line extending in a first direction on the substrate;
    a second voltage line extending in a second direction crossing the first direction on the first voltage line and connected to the first voltage line;
    a first electrode of each of the first, second, and third pixels, the first electrode being on the second voltage line to receive a driving current;
    a second electrode of each of the first, second, and third pixels and a third electrode of each of the first, second, and third pixels, the second and third electrodes being parallel to the first electrode and connected to the second voltage line;
    a first contact electrode of each of the first, second, and third pixels, the first contact electrode being on the first electrode and connected to the first electrode; and
    a second contact electrode of each of the first, second, and third pixels, the second contact electrode being at a same layer as the first contact electrode and insulated from the first, second, and third electrodes.

2. The display device of claim 1, further comprising:
    an active layer on the first voltage line; and
    an auxiliary gate line in a layer between the active layer and the second voltage line and extending in the first direction.

3. The display device of claim 2, wherein the second electrode of the second pixel is to receive a low potential voltage from the second voltage line to reduce a capacitance between the auxiliary gate line and the second contact electrode of the second pixel.

4. The display device of claim 2, further comprising:
    a first gate line at a same layer as the first voltage line; and
    a second gate line at a same layer as the second voltage line and connected between the first gate line and the auxiliary gate line.

5. The display device of claim 4, further comprising a first auxiliary electrode at a same layer as the auxiliary gate line to overlap the first gate line.

6. The display device of claim 5, wherein the second electrode of the first pixel is to receive a low potential voltage from the second voltage line to reduce a capacitance between the first auxiliary electrode and the second contact electrode of the first pixel.

7. The display device of claim 4, further comprising a second auxiliary electrode at a same layer as the second gate line to overlap the first gate line.

8. The display device of claim 7, wherein the second electrode of the first pixel is to receive a low potential voltage from the second voltage line to reduce a capacitance between the second auxiliary electrode and the second contact electrode of the first pixel.

9. The display device of claim 4, wherein in a plan view, the first electrode of each of the first, second, and third pixels has one end adjacent to the second gate line and other end adjacent to the second voltage line, the one end and the other end of the first electrode being cut, and the second electrode of each of the first, second, and third pixels has one end adjacent to the second gate line, the one end of the second electrode being cut.

10. The display device of claim 1, further comprising a connector extending in the second direction to connect the second electrode of the first pixel to the third electrode of the second pixel.

11. The display device of claim 1, further comprising a connector extending in the second direction to connect the second electrode of the second pixel to the third electrode of the third pixel.

12. The display device of claim 1, wherein the first electrode extends in the first direction, the second electrode is on one side of the first electrode, and the third electrode is on other side of the first electrode.

13. The display device of claim 12, wherein the second contact electrode of each of the first, second, and third pixels comprises:
    a first portion extending in the first direction on the second electrode;
    a second portion bent from the first portion and extending in the second direction; and
    a third portion bent from the second portion and located on the first electrode.

14. The display device of claim 1, wherein each of the first, second, and third pixels comprises:
    a first transistor between a driving voltage line and a plurality of light emitting elements to supply a driving current to the plurality of light emitting elements;
    a second transistor configured to connect a data line to a first node that is a gate electrode of the first transistor based on a gate signal;
    a third transistor configured to connect a sensing line to a second node that is a source electrode of the first transistor based on the gate signal; and
    a storage capacitor connected between the first node and the second node.

15. The display device of claim 14, further comprising:
    a plurality of first light emitting elements connected between the first contact electrode and the second contact electrode; and
    a plurality of second light emitting elements connected between the second contact electrode and the third electrode.

16. The display device of claim 15, wherein the second contact electrode is a third node between the plurality of first light emitting elements and the plurality of second light emitting elements.

17. The display device of claim 15, wherein the plurality of first light emitting elements is aligned between the first electrode and the second electrode, and the plurality of second light emitting elements is aligned between the first electrode and the third electrode.

18. The display device of claim 14, further comprising a first connection electrode at a same layer as the second voltage line and connected between the first electrode and the source electrode of the first transistor, wherein the gate electrode of the first transistor is a first capacitor electrode of the storage capacitor, and the first connection electrode is a second capacitor electrode of the storage capacitor.

19. The display device of claim 1, further comprising a second connection electrode bent from the second voltage line to overlap the first voltage line in a thickness direction of the display device, and directly connected to the first voltage line through a plurality of contact holes.

20. A display device comprising:
a substrate including a plurality of pixel areas comprising first, second, and third pixels;
a first voltage line extending in a first direction on the substrate;
an active layer on the first voltage line;
an auxiliary gate line extending in the first direction on the active layer;
a second voltage line extending in a second direction crossing the first direction on the auxiliary gate line and connected to the first voltage line;
a first electrode on the second voltage line and connected to the active layer;
a second electrode and a third electrode parallel to the first electrode and connected to the second voltage line;
a first contact electrode on the first electrode and connected to the first electrode; and
a second contact electrode on the first electrode and the second electrode and insulated from the first, second, and third electrodes.

* * * * *